United States Patent
Hoegerl et al.

(10) Patent No.: US 9,070,067 B2
(45) Date of Patent: Jun. 30, 2015

(54) SMART CARD MODULE AND METHOD FOR PRODUCING A SMART CARD MODULE

(71) Applicant: Infineon Technologies AG, Neubiberg (DE)

(72) Inventors: Juergen Hoegerl, Regensburg (DE); Andreas Mueller-Hipper, Regensburg (DE); Frank Pueschner, Kelheim (DE); Wolfgang Schindler, Regenstauf (DE); Peter Stampka, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/292,270

(22) Filed: May 30, 2014

(65) Prior Publication Data

US 2014/0353387 A1 Dec. 4, 2014

(30) Foreign Application Priority Data

Jun. 4, 2013 (DE) .......................... 10 2013 105 729

(51) Int. Cl.
*G06K 19/06* (2006.01)
*G06K 19/077* (2006.01)
*H01L 23/00* (2006.01)

(52) U.S. Cl.
CPC .... *G06K 19/07743* (2013.01); *G06K 19/07728* (2013.01); *G06K 19/07745* (2013.01); *H01L 24/83* (2013.01)

(58) Field of Classification Search
USPC .................. 235/492, 380, 488, 487, 375, 451
See application file for complete search history.

(56) References Cited

U.S. PATENT DOCUMENTS

| | | | |
|---|---|---|---|
| 6,440,773 B1 * | 8/2002 | Usami ........................... | 438/107 |
| 2004/0169086 A1 * | 9/2004 | Ohta et al. ..................... | 235/492 |
| 2009/0065592 A1 * | 3/2009 | Paul et al. ..................... | 235/492 |
| 2010/0038438 A1 * | 2/2010 | Kim et al. ..................... | 235/492 |
| 2011/0011939 A1 * | 1/2011 | Seah ............................. | 235/492 |
| 2014/0042230 A1 * | 2/2014 | Pueschner et al. ............ | 235/492 |

OTHER PUBLICATIONS

Unknown, "FCOS Flip Chip on Substrate, The Evolution of Chip Card Modules, " Infineon Technologies AG, Muenchen, Germany, 2004, pp. 1-2.

* cited by examiner

*Primary Examiner* — Edwyn Labaze

(74) *Attorney, Agent, or Firm* — Murphy, Bilak & Homiller, PLLC

(57) ABSTRACT

A smart card module for use in a smart card includes a microchip and a contact zone for making contact with the microchip by means of a reader. The microchip can be enclosed by an encapsulation which can enclose the microchip completely from all sides.

21 Claims, 6 Drawing Sheets

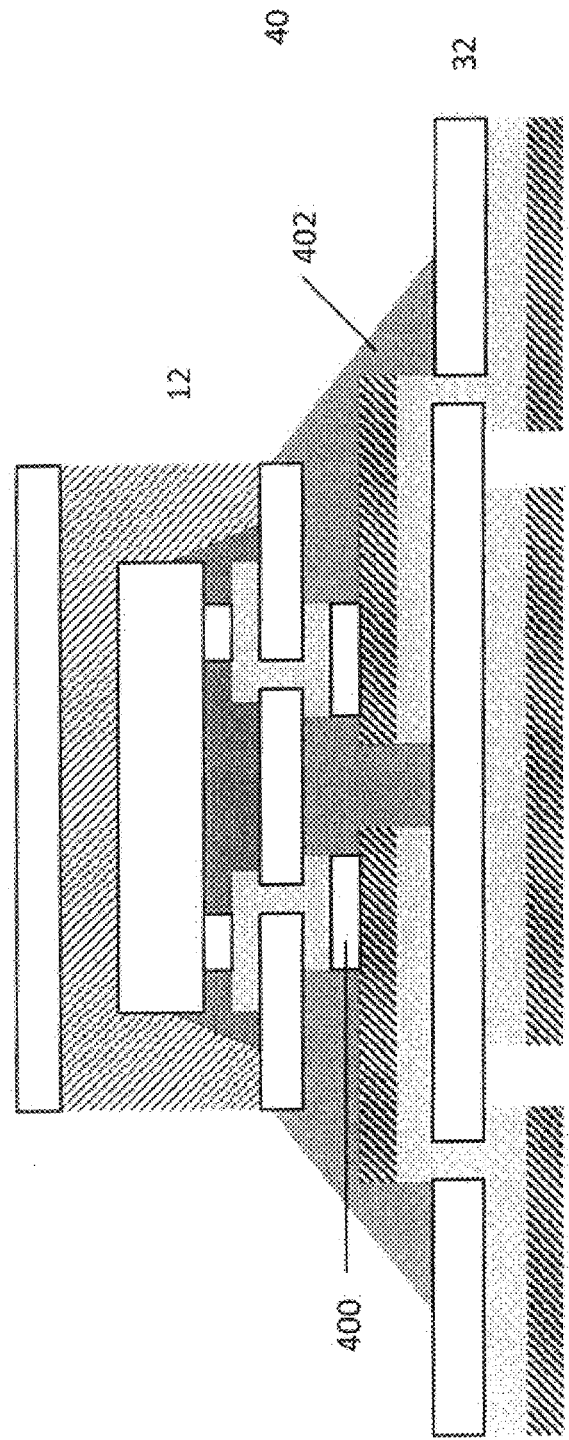

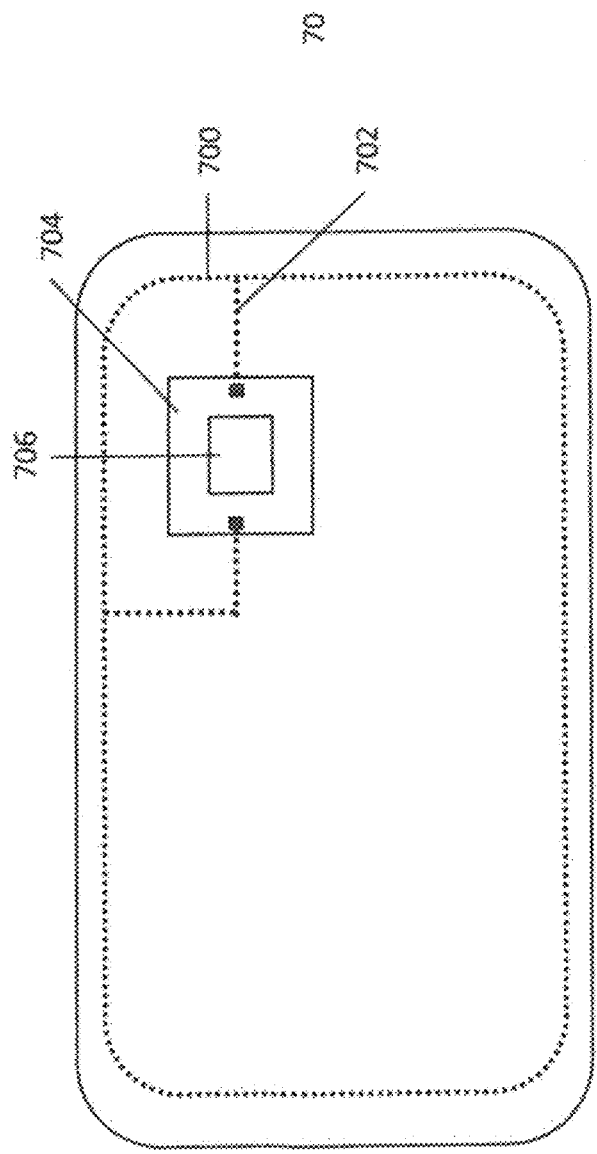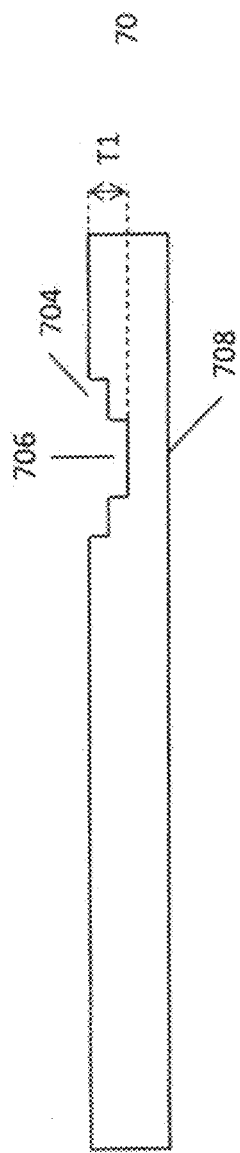
Fig. 4A
Fig. 4B

SMART CARD MODULE AND METHOD FOR PRODUCING A SMART CARD MODULE

PRIORITY CLAIM

This application claims priority to German Patent Application No. 10 2013 105 729.2, filed on 4 Jun. 2013, the content of said German application incorporated herein by reference in its entirety.

TECHNICAL FIELD

The present application relates to a smart card module and to a method for producing smart card modules.

BACKGROUND

Smart card modules for incorporation in smart cards are used in a variety of applications, such as e.g. in EC cards, electronic health cards or in SIM cards. These modules generally consist of a semiconductor chip and a substrate carrying the chip. Access to the chip is effected through an interface integrated into the smart card. Said interface can be configured as contact-based by means of a specially fashioned contact zone, or as contactless by means of a coil which manipulates an external electromagnetic field. Both techniques are used in so-called dual-interface cards. The contact zone is generally a part of the smart card module which is inserted into a stamped-out portion of the smart card. The sequence of a contact-based information exchange between the smart card and a card reader is regulated by ISO 7816.

In order to protect the chips, they can be sealed by a mold or a glob-top after fitting on the substrate. This way of protecting the chip can be costly e.g. on account of the materials to be used.

For this and other reasons, there is a need for the present invention.

SUMMARY

A package and a substrate for fabricating a smart card module are provided. The package can comprise a microchip and an encapsulation, wherein the encapsulation can be fashioned in such a way that it is highly robust and effectively protects the microchip against damage. In particular, as a result it can be possible to use a thinned microchip (CIS—chip in substrate). The package can furthermore contain a redistribution wiring that serves for making electrical contact with the microchip. The package can be fitted on the substrate using the so-called flip-chip arrangement (FCIS).

The substrate can have a contact zone, e.g. according to ISO 7816, and also a mounting surface designed for fitting the package with the microchip on the substrate, and a redistribution wiring that serves to electrically connect the microchip to the contact surface. The package can be fitted on the mounting surface of the substrate permanently by means of suitable measures.

Owing to the use of a package, it is possible to dispense with a mold or glob-top for protecting the chip and high quality and lifetime requirements can nevertheless be fulfilled.

Those skilled in the art will recognize additional features and advantages upon reading the following detailed description and on viewing the accompanying drawings.

BRIEF DESCRIPTION OF THE DRAWINGS

The accompanying drawings are provided in order to impart a further understanding of embodiments and are integrated into the present description and form a part thereof. The drawings show embodiments and serve together with the description to elucidate principles of embodiments. Further embodiments and many of the intended advantages of embodiments will become readily apparent if they become more comprehensible by reference to the following detailed description. The elements of the drawings are not necessarily true to scale with respect to one another. Identical reference numerals identify corresponding similar parts.

FIG. 1, including FIGS. 1A and 1B, schematically shows components of a smart card module where

FIG. 3, including

FIG. 4, including FIGS. 4A and 4B, schematically shows a card having a cavity into which a smart card module can be inserted where FIG. 4A shows a plan view and FIG. 4B a cross-sectional view of the card.

DETAILED DESCRIPTION

Figure 1A:
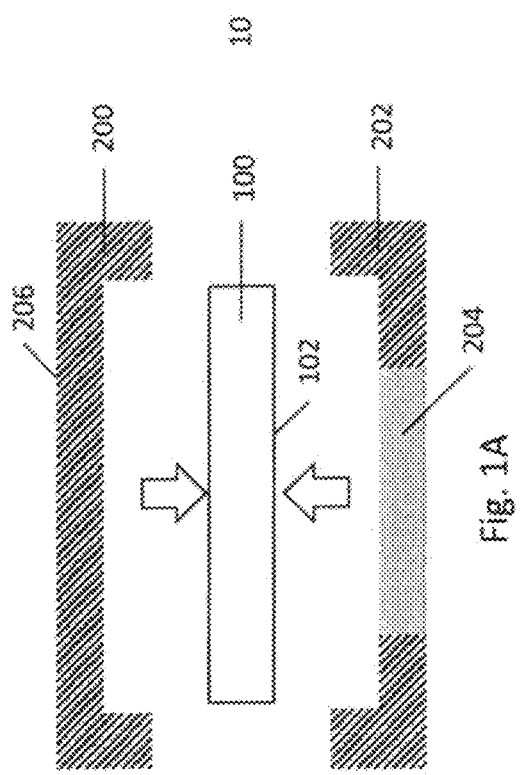
FIG. 1A shows a cross section of a package comprising a microchip and an encapsulation and FIG. 1B shows a cross section of a substrate comprising a mounting surface for a package and a contact zone for externally making contact with the microchip.

In the following detailed description, reference is made to the accompanying drawings, which form a part of this description and show for illustration purposes specific embodiments in which the invention can be implemented. In this regard, direction terminology such as, for instance, "at the top", "at the bottom", "at the front", "at the back", "front", "rear", etc. is used with reference to the orientation of the figure(s) described. Since component parts of embodiments can be positioned in a number of different orientations, the direction terminology serves for illustration purposes and is not in any way restrictive. It goes without saying that other embodiments can be used and structural or logical modifications can be made, without departing from the scope of protection of the present invention. The following detailed description should therefore not be interpreted in a restrictive sense, and the scope of protection of the present invention is defined by the appended claims.

The features of the different exemplary embodiments described herein can be combined with one another, unless specifically mentioned otherwise.

In the present description, the expressions "coupled" and/or "electrically coupled" are not intended to mean that the elements must be directly coupled; intervening elements can be provided between the "coupled" or "electrically coupled" elements.

Arrangements which contain one or a plurality of semiconductor chips are described below. The semiconductor chips can be of different types, produced by different technologies and comprise for example integrated electrical and/or passive elements. In one embodiment, semiconductor chips having a vertical structure can occur, that is to say that the semiconductor chips can be produced such that electric currents can flow in a direction perpendicular to the main surfaces of the semiconductor chips. In one embodiment, a semiconductor chip having a vertical structure can have contact elements on its two main surfaces, that is to say on its top side and its underside.

The semiconductor chips need not be produced from specific semiconductor material, such as, for instance, Si, SiC, SiGe, GaAs, and can furthermore contain inorganic and/or organic materials that are not semiconductors, such as, for example, insulators, plastics or metals.

The semiconductor chips can have electrodes (or contact locations or contact surfaces) which allow the production of an electrical contact with the integrated circuits contained in the semiconductor chips. One or a plurality of metal layers can be applied to the electrodes of the semiconductor chips. The metal layers can be produced with any desired geometric shape and any desired material composition. The metal layers can be present for example in the form of a layer that covers a region. Any desired metal or any desired metal alloy can be used as the material, such as, for example, aluminum, titanium, gold, silver, copper, palladium, platinum, nickel, chromium or nickel-vanadium. The metal layers need not be homogeneous or produced from only one material, that is to say that different compositions and concentrations of the materials contained in the metal layers are possible. The electrodes can be situated on the active main surfaces of the semiconductor chips or on other surfaces of the semiconductor chips.

The semiconductor chips can be positioned on leadframes. The leadframes can comprise any desired material. The leadframes can comprise carriers (die pads) and connecting leads. During the production of the arrangements, the carriers and connecting leads can be connected to one another. The carriers and connecting leads can also be produced from one piece. The carriers and connecting leads can be interconnected by connection means with the aim of separating specific carriers and connecting leads in the course of production. The carriers and connecting leads can be separated by mechanical sawing, a laser beam, cutting, stamping, grinding, milling, etching or any other suitable method. The leadframes can be electrically conductive. They can be produced, for example completely, from metals or metal alloys, copper, copper alloys, iron-nickel, aluminum, aluminum alloys, steel, stainless steel or other suitable materials. The leadframes can be coated with an electrically conductive material, for example copper, silver, iron-nickel or nickel-phosphorus. The connecting leads of the leadframe can be bent in an S-shape manner, for example, during production.

One or a plurality of metal layers can be positioned above the semiconductor chip. The metal layers can be used, for example, to produce a redistribution wiring layer. The metal layers can be used as wiring layers for producing an electrical contact with the semiconductor chip from outside the arrangement and/or for producing an electrical contact with other semiconductor chips and/or components contained in the arrangement. The metal layers can be produced with any desired geometric shape and any desired material composition. The metal layers can consist of conductor tracks, for example, but can also be present in the form of a layer covering a region. Any desired metal, for example aluminum, nickel, palladium, silver, tin, gold or copper, or a metal alloy can be used as the material. The metal layers need not be produced homogeneously or from only one material, that is to say that different compositions and concentrations of the materials contained in the metal layers are possible. Furthermore, the metal layers can be arranged above or below or between electrically insulating layers.

The arrangements described below comprise external contact elements or external contact locations which can have any desired shape and size. The external contact elements can be accessible from outside the arrangement and can thus allow the production of an electrical contact with the semiconductor chips from outside the arrangement. For this reason, the external contact elements can have external contact surfaces which are accessible from outside the arrangement. Furthermore, the external contact elements can be thermally conductive and can serve as heat sinks for dissipating the heat generated by the semiconductor chips. The external contact elements can be composed of any desired electrically conductive material, for example of a metal such as, for instance, copper, aluminum or gold, a metal alloy, or an electrically conductive organic material. Specific external contact elements can be connecting leads of a leadframe.

The arrangements can comprise a molding material that covers at least parts of the components of the arrangements. The molding material can be any desired suitable thermoplastic or thermally curing material. Various techniques can be used to cover the components with the molding material, for example compression molding, injection molding, powder molding methods or liquid molding.

The arrangements can have mounting surfaces. The mounting surface can serve for mounting the arrangement on a different component. External contact elements comprising external contact surfaces can be arranged on the mounting surface in order to electrically couple the arrangement to the component on which the arrangement is mounted. Solder deposits such as, for instance, solder balls or other suitable connecting elements can be used to produce an electrical and mechanical connection between the arrangement and the component on which the arrangement is mounted.

Various components of a smart card module are explained below with reference to FIG. 1.

A schematic illustration of the components of a CIS package 10, which can comprise a microchip 100, a cover 200 and a base 202, is shown with reference to FIG. 1A. The base 202 can have an electrical connection 204, to which the active side 102 of the microchip 100 can be fitted and which can be designed for making electrical contact with the microchip 100.

In accordance with one embodiment, the cover 200 can also have further electrically conductive components. These further electrically conductive components can be electrically connected to the electrical connection 204 or else isolated from the electrical connection 204. By way of example, the surface 206 can have an electrically conductive layer which wholly or partly covers the surface 206.

The cover 200 and base 202 can be configured in such a way that an accurately fitting encapsulation is formed which completely encloses the microchip 100. This encapsulation comprising the cover 200 and base 202 can advantageously increase the robustness of the microchip 100 and effectively protect it against warpage, fracture or other damage.

In accordance with one embodiment, the cover 200 and base 202 can be laminated onto one another in order to produce a sealed and permanent encapsulation of the microchip 100.

In accordance with one embodiment, the cover 200 can consist of epoxy resin with integrated $SiO_2$. In accordance with another embodiment, the cover 200 can consist of some other appropriate material. In accordance with one embodiment, the cover 202 can consist of epoxy resin with glass fiber reinforcement, as is customary in the case of printed circuit boards. In accordance with another embodiment, the base 202 can consist of some other appropriate material.

In comparison with a mold or a glob-top, the CIS package 10 can be significantly smaller. By virtue of this saving of encapsulation material, the CIS package 10 can be more cost-effective than a chip encapsulation by mold or glob-top. The encapsulation can be in particular of a size similar to the microchip (chip size package). In accordance with one embodiment, the thickness of the encapsulation can be 50 µm-150 µm.

In accordance with one embodiment, the microchip 100 can be thinned on account of the mechanically stabilizing CIS package. In this context, thinned means that material is removed from a semiconductor wafer comprising a number of semiconductor chips, on that side of the wafer which is situated opposite the active side of the semiconductor chips. In particular, the microchip 100 can have a thickness of 10 µm-100 µm, in particular 30 µm-70 µm, measured from the active side 102 to the opposite side.

A mold or glob-top cannot stabilize a microchip in the same way as such as laminated package. For this reason, with the use of mold or glob-top the microchip can have a thickness which is significantly greater than the minimum thickness which is possible with the use of a CIS package.

Figure 1B:
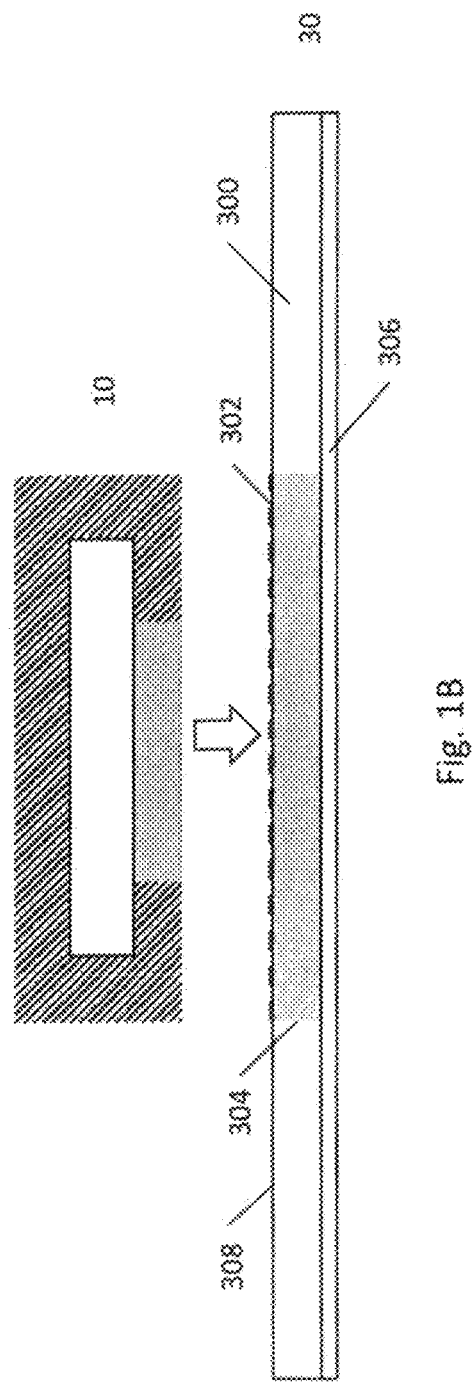

A carrier 30 which can be designed for receiving a CIS package 10 is shown with reference to FIG. 1B. The carrier 30 can comprise a substrate 300 having a mounting surface 302, which can be configured in such a way that the CIS package 10 can be permanently and fixedly fitted thereon. The carrier 30 can furthermore comprise a second electrical connection 304, which can be configured in such a way that it connects the microchip 100 to contacts of a contact zone 306 via the first electrical connection 204.

In accordance with one embodiment, the CIS package 10 is applied to the mounting surface 302 in a pick and place process.

In accordance with one embodiment, the CIS package 10 is fixedly and permanently connected to the carrier 30 by non-conductive adhesive (nonconductive paste). In accordance with another embodiment, the CIS package 10 is fixedly and permanently connected to the carrier 30 by solder. The solder can be applied in such a way that it produces an electrical contact between the first electrical connection 204 and the second electrical connection 304. In accordance with a further embodiment, a combination of nonconductive adhesive and solder is used to fixedly and permanently connect CIS package 10 and carrier 30.

In accordance with one embodiment, the contact zone 306 can be a contact zone according to ISO 7816. The microchip 100 can be connected to a smart card reader via the contact zone 306.

In accordance with one embodiment, the substrate 300 can consist of a cost-effective, flexible nonconductive material, such e.g. epoxy resin, PET, polyimide or a suitable compound of such materials. In accordance with one embodiment, the substrate 300 can be an FCOS (Flip Chip On Substrate) flex tape.

The substrate 300 can furthermore be fashioned as transparent or nontransparent, in particular black. The substrate 300 can be flexible, in particular, it can be more flexible and/or less robust than the CIS package 10. The substrate 300 can wholly or partly consist of PET (polyethylene terephthalate).

A smart card module consisting of the carrier 30 and CIS package 10 fitted thereon can be thin. The smart card module can have a thickness of 250 µm-500 µm, in particular 300 µm-400 µm, measured from the surface 206 as far as the contact zone 306.

Such a smart card module can furthermore have a long lifetime on account of its robustness. In particular, the lifetime can be more than 10 years.

In accordance with one embodiment, the surface 308 to which the CIS package 10 is applied can have further electrical components in addition to the second electrical connection 306. By way of example, the surface 308 can have a coil and/or mounting surfaces for further electrical components in addition to the CIS package 10.

In accordance with one embodiment, a further nonconductive layer can be applied (not depicted) on that part of the surface 308 which is free, i.e. is not covered by the package 10. Said further nonconductive layer can serve to protect the further electrical components against damage.

Figure 2A:
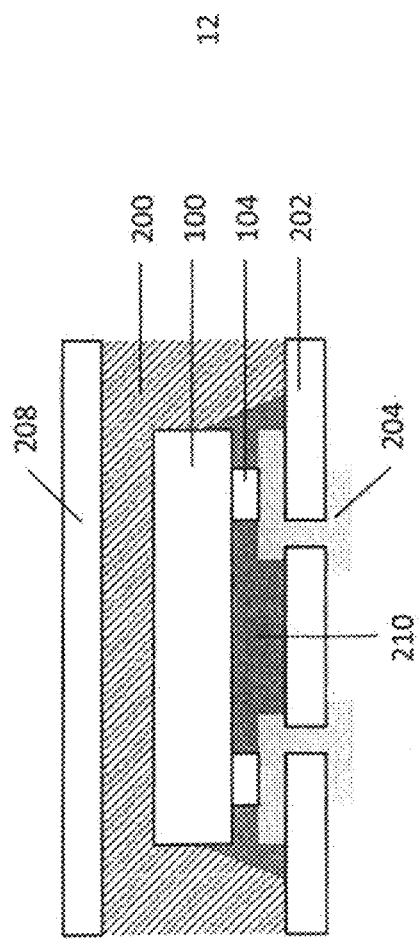
FIG. 2, including FIGS. 2A-2C, schematically shows one embodiment of a smart card module in cross-sectional illustration.

One embodiment of a CIS package 12 for use in a smart card module is shown with more details with reference to FIG. 2A. In particular, this shows that the microchip 100 of the CIS package 12 can be mounted on the base 202 of the package using flip-chip mounting.

In accordance with one embodiment, the base 202 can be a printed circuit board. The active side of the microchip 100 is connected to a first redistribution wiring 206 via soldering points 104. Electrical contact can be made with the microchip externally via the redistribution wiring 206. A nonconductive adhesive 210 (underfiller NCP) can serve for fixedly connecting the microchip 100 to the printed circuit board 202.

The cover 200 can enclose the microchip 100 with an accurate fit and can be permanently and fixedly connected to the printed circuit board 202 by lamination. The cover 200 can furthermore have a metallic layer 208.

Figure 2B:
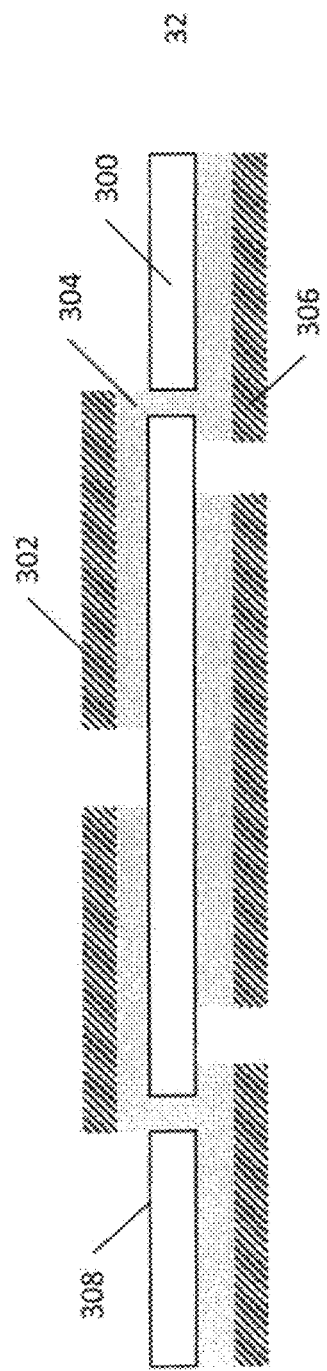

One embodiment of a carrier 32 is shown with more details with reference to FIG. 2B. The carrier 32, as explained above, can have a second redistribution wiring 304. The second redistribution wiring can consist e.g. of Cu, or of Ni, or of NiAu, or of NiPd, or of Pd. Further metal layers can be applied on the second redistribution wiring along the mounting surface 302 and along the contact zone 306. The further metal layers can consist of a different metal than the redistribution wiring 304.

One embodiment of a smart card module 40 comprising a CIS package 12 and a carrier 32 is shown with reference to FIG. 2C. The first redistribution wiring 204 can be connected to the second redistribution wiring 304 by soldering points 400. The CIS package 12 can be mechanically stably connected to the carrier 32 by means of nonconductive adhesive 402.

Figure 3A:
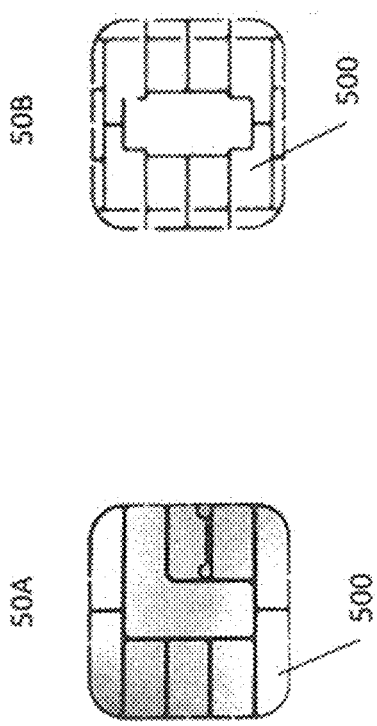
FIGS. 3A and 3B, shows in plan view embodiments of two main surfaces of a substrate for a smart card module.

Two possible embodiments 50A, 50B of the contact zone 306 are shown with reference to FIG. 3A. The individual contacts 500 of the contact zone have defined positions and shapes according to ISO 7816.

Figure 3B:
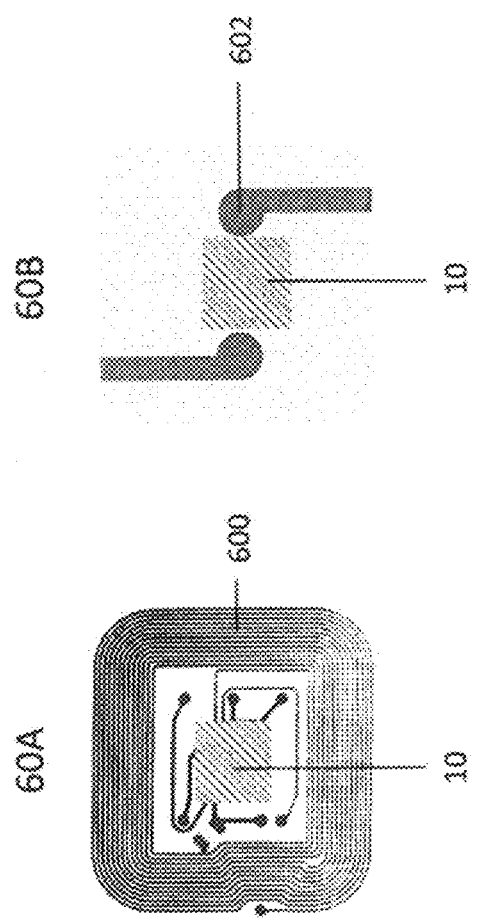

Two possible embodiments 60A, 60B of a smart card module are shown with reference to FIG. 3B, wherein the embodiments 60A, 60B have different carrier surfaces 308. In accordance with one embodiment, besides the contact surface 302 for the CIS package 10, the carrier surface 308 can have further electrical functions, e.g. a coil 600 as in the embodiment 60A. The coil can serve to produce a contactless connection between the microchip 100 and an external reader. In another embodiment, the coil 600 can serve to produce an inductive coupling to a larger coil 700 accommodated on the card 70 e.g. as shown in FIG. 4A.

In accordance with the embodiment 60B, the carrier surface 308 can have contacts 602 which can serve to connect the microchip 100 to a coil 700 on the card 70.

One embodiment of a card 70, which can have a coil 700 with contacts 702, and also a first cavity 704 and a second, deeper cavity 706, is shown with reference to FIG. 4A. In contactless or in so-called dual-interface smart cards, the coil 700 can serve to produce a connection between the microchip 100 and an external reader. The term dual-interface denotes smart cards which have both a contact zone for contact-based data transmission and a coil for contactless data transmission.

The cavities 704, 706 of the card 70 can be fashioned in such a way that there is space for a smart card module 40, which can comprise a CIS package 10 and a carrier 30, completely in the cavities 704, 706 and a contact zone 306 can terminate flush with the surface of the card 70. A suitable adhesive material can serve for permanently and fixedly connecting the smart card module 40 and the card 70. Such a composite assembly is designated as a smart card.

A cross section of a card 70 comprising a first cavity 704 and a second, deeper cavity 706 is shown with reference to FIG. 4B. On account of the small structural height of the smart card module 40 as explained further above, the total depth T1 of the two cavities can be smaller than would be possible for smart card modules comprising a non-thinned microchip with a glob-top or mold. This can improve the optical quality and the mechanical stability of the card 70 in the region of the cavities. In particular, this can have the effect that, in the region 708 of the card 70 situated opposite the cavities, an indentation can occur which is less pronounced than can be the case for deeper cavities. By way of example, it can be possible to perform laser engraving in the region 708 of the card 70 as well.

Owing to the use of a CIS package 10, in accordance with one embodiment, adhesive material can be applied not only on the surface 308 of the carrier 30 but also in the region of the surface 206 of the CIS package 10, in order to fix the smart card module 40 in the cavities 704, 706. Such an enlarged adhesive-bonding surface can improve the planarity of the smart card module 40 in the card 70.

Figure 5:
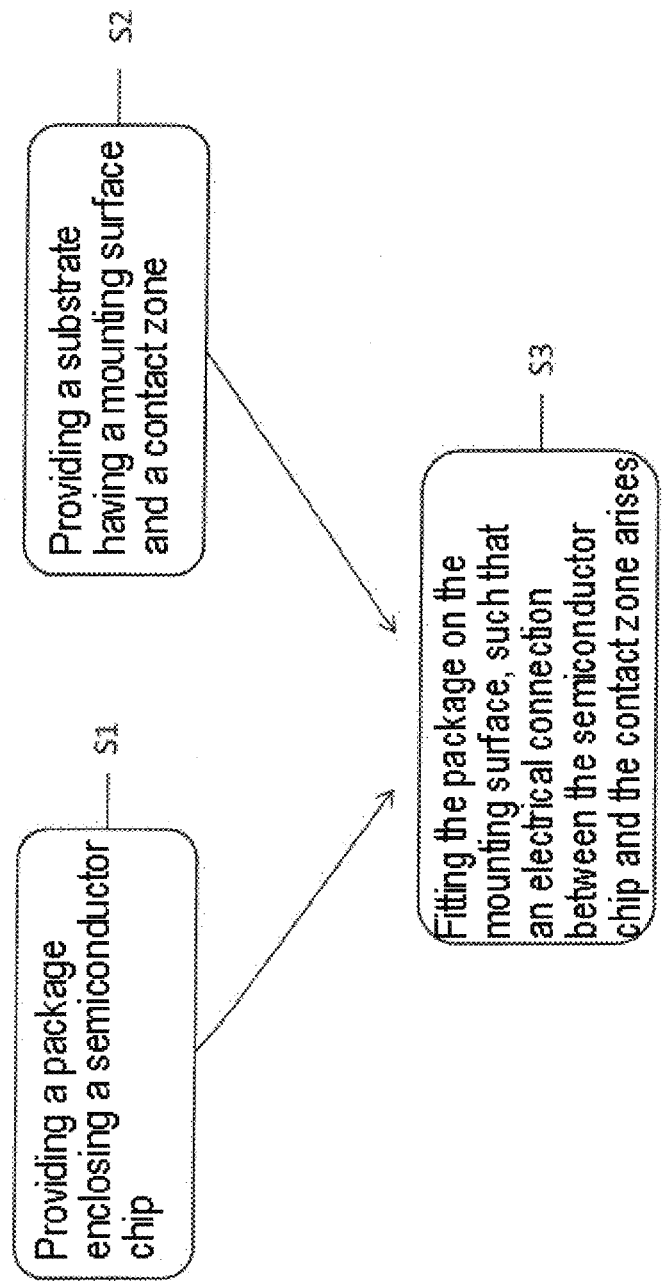
FIG. 5 shows a flow chart of a method for producing smart card modules.

A flow chart of one embodiment of a method for producing smart card modules is shown with reference to FIG. 5. The method comprises providing S1 a package containing a microchip, providing S2 a substrate having a mounting surface for the package and a contact surface for contact-based connection to the microchip, and fitting S3 the package on the substrate, such that an electrical connection between the microchip and the contact zone arises.

Although specific embodiments have been illustrated and described here, it is evident to those of average skill in the art that diverse alternative and/or equivalent implementations could replace the specific embodiments shown and described, without departing from the scope of protection of the present invention. The present application is intended to cover any adaptations or variants of the specific embodiments discussed here. Therefore, the intention is for the present invention to be restricted only by the claims and their equivalents.

What is claimed is:

1. A smart card module, comprising:
   a microchip;
   a cover and a base laminated onto one another to form a sealed and permanent encapsulation of the microchip from all sides, the base having a first electrical connection to which an active side of the microchip is fitted and for making electrical contact with the microchip; and
   a substrate comprising a mounting surface to which the base of the encapsulation is permanently and fixedly fitted, and a second electrical connection which electrically connects the microchip to contacts of a contact zone disposed on an opposite surface of the substrate as the mounting surface, the second electrical connection extending from the mounting surface to the opposite surface of the substrate.

2. The smart card module of claim 1, wherein construction and operation of the contact zone are regulated according to ISO 7816.

3. The smart card module of claim 1, wherein the cover of the encapsulation at least partly consists of epoxy resin with integrated $SiO_2$.

4. The smart card module of claim 1, wherein the base of the encapsulation comprises a printed circuit board.

5. The smart card module of claim 1, wherein the substrate at least partly consists of PET.

6. The smart card module of claim 1, wherein the microchip is a thinned microchip.

7. The smart card module of claim 6, wherein the thinned microchip has a thickness in a range of 10 µm to 100 µm.

8. The smart card module of claim 1, wherein the smart card module has a total thickness of less than 400 µm.

9. The smart card module of claim 1, wherein the base of the encapsulation is a printed circuit board and the first electrical connection is a first redistribution wiring disposed on opposing main surfaces of the printed circuit board and which extends through the printed circuit board.

10. The smart card module of claim 9, wherein the active side of the microchip is connected to the first redistribution wiring via soldering points.

11. The smart card module of claim 9, wherein the second electrical connection is a second redistribution wiring disposed on the opposing surfaces of the substrate and which extends through the substrate.

12. The smart card module of claim 11, wherein the first redistribution wiring is connected to the second redistribution wiring by soldering points.

13. The smart card module of claim 11, wherein the base of the encapsulation is mechanically connected to the substrate by a nonconductive adhesive.

14. The smart card module of claim 1, further comprising a metallic layer on a main surface of the cover facing away from the base.

15. The smart card module of claim 1, further comprising a coil disposed on the mounting surface of the substrate which provides a contactless connection between the microchip and an external reader.

16. A smart card, comprising:
   a card body; and
   a smart card module disposed in the card body, the smart card module comprising:
      a microchip;
      a cover and a base laminated onto one another to form a sealed and permanent encapsulation of the microchip from all sides, the base having a first electrical connection to which an active side of the microchip is fitted and for making electrical contact with the microchip; and
      a substrate comprising a mounting surface to which the encapsulation is permanently and fixedly fitted, and a second electrical connection which electrically connects the microchip to contacts of a contact zone disposed on an opposite surface of the substrate as the mounting surface, the second electrical connection extending from the mounting surface to the opposite surface of the substrate.

17. The smart card of claim 16, wherein the contact zone terminates flush with a surface of the card body.

18. The smart card of claim 16, further comprising a coil disposed on the mounting surface of the substrate which provides a contactless connection between the microchip and an external reader.

19. The smart card of claim 18, further comprising a larger coil disposed in the card body, wherein the coil disposed on the mounting surface of the substrate is inductively coupled to the larger coil disposed in the card body.

20. The smart card of claim 19, wherein the mounting surface of the substrate has contacts which connect the microchip to the larger coil disposed in the card body.

21. The smart card of claim 16, wherein:
- the card body has a first, shallower cavity and a second, deeper cavity;
- the second, deeper cavity is sized to receive the encapsulation of the smart card module; and
- the first, shallower cavity is sized to receive the substrate of the smart card module.

* * * * *